(12) United States Patent
Bousquet et al.

(10) Patent No.: US 10,181,713 B2
(45) Date of Patent: Jan. 15, 2019

(54) METHODS OF POST-PROCESS DISPENSATION OF PLASMA INDUCED DAMAGE PROTECTION COMPONENT

(71) Applicant: GlobalFoundries, Inc., Grand Cayman (KY)

(72) Inventors: Arnaud Bousquet, Wilton, NY (US); Geetha Sai Aluri, Clifton Park, NY (US); Suresh Uppal, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 334 days.

(21) Appl. No.: 14/517,605

(22) Filed: Oct. 17, 2014

(65) Prior Publication Data

US 2016/0111867 A1    Apr. 21, 2016

(51) Int. Cl.
| | |
|---|---|
| *H02H 3/08* | (2006.01) |
| *H01L 21/66* | (2006.01) |
| *H01L 21/8234* | (2006.01) |
| *H01L 23/525* | (2006.01) |
| *H01L 27/02* | (2006.01) |
| *H01L 29/66* | (2006.01) |
| *H01L 29/78* | (2006.01) |
| *H01L 49/02* | (2006.01) |

(52) U.S. Cl.
CPC ........... *H02H 3/08* (2013.01); *H01L 23/5256* (2013.01); *H01L 27/0255* (2013.01); *H01L 29/6609* (2013.01); *H01L 22/14* (2013.01); *H01L 2924/0002* (2013.01)

(58) Field of Classification Search
CPC ....... H02H 3/08; H01L 21/8243; H01L 22/20; H01L 22/30; H01L 23/5256; H01L 27/0255; H01L 27/0288; H01L 28/20; H01L 29/6609; H01L 29/66568; H01L 29/78
USPC .......................................................... 361/101
See application file for complete search history.

(56) References Cited

U.S. PATENT DOCUMENTS

| | | | | |
|---|---|---|---|---|
| 7,821,100 B2 * | 10/2010 | Higuchi | ............... | H01L 23/5256 257/209 |
| 2001/0042887 A1 * | 11/2001 | Lee | ...................... | H01L 27/0255 257/355 |
| 2004/0224444 A1 * | 11/2004 | Hisaka | ................ | H01L 23/5256 438/132 |
| 2009/0174029 A1 * | 7/2009 | Ueda | ................... | H01L 23/5256 257/529 |
| 2013/0113049 A1 * | 5/2013 | Fang | ..................... | G11C 29/785 257/379 |

* cited by examiner

*Primary Examiner* — Kevin J Comber
(74) *Attorney, Agent, or Firm* — Williams Morgan, P.C.

(57) ABSTRACT

At least one method, apparatus and system disclosed herein involves providing an integrated circuit device comprising a protection circuit. And integrated circuit device is formed. A protection component is formed in parallel to the integrated circuit device. The protection component is configured for protecting the integrated circuit device from a portion of a charge. A circuit break device in series to the protection component, wherein the protection component and the circuit break device are in parallel to the integrated circuit device. The circuit break device is configured to break an electrical path of the protection component for electrically terminating the protection component based upon a current signal.

19 Claims, 10 Drawing Sheets

METHODS OF POST-PROCESS DISPENSATION OF PLASMA INDUCED DAMAGE PROTECTION COMPONENT

FIELD OF THE INVENTION

Generally, the present disclosure relates to the manufacture of sophisticated semiconductor devices, and, more specifically, to various methods and structures for post-process dispensation of protection components.

DESCRIPTION OF THE RELATED ART

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot, using semiconductor-manufacturing tools, such as exposure tool or a stepper. As an example, an etch process may be performed on the semiconductor wafers to shape objects on the semiconductor wafer, such as polysilicon lines, each of which may function as a gate electrode for a transistor. As another example, a plurality of metal lines, e.g., aluminum or copper, may be formed that serve as conductive lines that connect one conductive region on the semiconductor wafer to another.

Various processes are performed on semiconductor substrates in manufacturing integrated circuit products. Some of these processes may be plasma based processing. For example, plasma processing in semiconductor manufacturing may include chemical vapor deposition (CVD), etching, dry cleaning (instead of wet chemical rinsing), etc. Plasma processing involves creating partially ionized gas by applying an electric filed. Ions can be accelerated, resulting ion bombardment of a wafer surface. This bombardment provides for plasma etching by direct means (sputtering, ion beam milling) or by indirect means by assisting chemical etching. Generally, positive ion-electron pairs are created by ionization reactions, however, accumulation of charges generally occur when using plasma processing. These charges may cause damage to circuits (e.g., transistors) formed on semiconductor wafers.

When integrated circuits are formed, tests are performed to determine the correctness in the operation of the circuits. For electrical testing of a discrete transistor (e.g., field effect transistor (FET)), the gate, source, and drain of the transistor are typically connected to probe pads. In order to reduce plasma processing induced damage of gate dielectric during the fabrication process or in the testing process, protection diodes are typically connected in parallel to the transistor.

Figure 1:
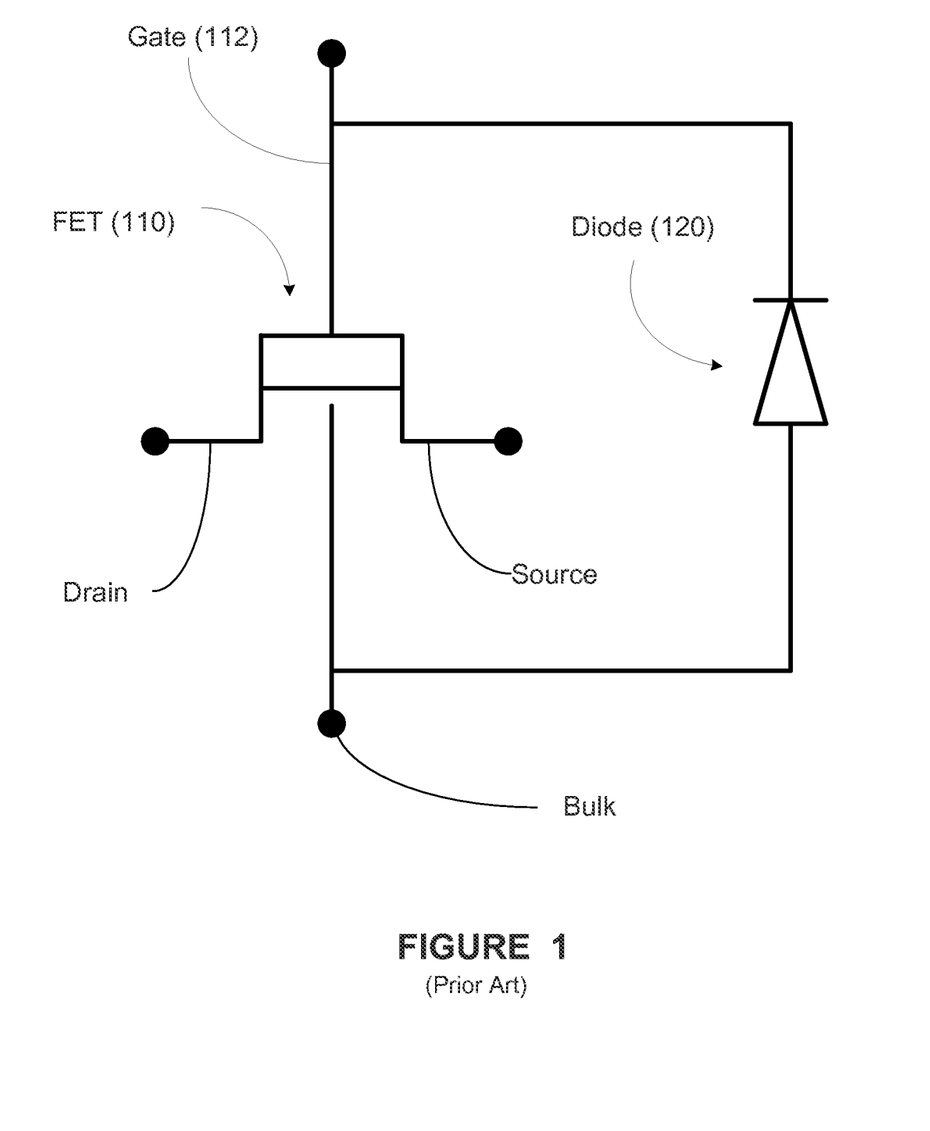
FIG. 1 illustrates a stylized depiction of a prior art circuit comprising a transistor coupled with a protection component.

Turning now to FIG. 1, a stylized depiction of a prior art circuit comprising a transistor coupled with a protection component is illustrated. As described above, the structure of FIG. 1 comprises a field-effect transistor (FET) 110 that is connected in parallel to a diode 120 formed to provide protection from accumulated charge caused by plasma process, as described above. The structure of FIG. 1 comprises a gate 112, wherein the protection diode 110 is connected to the node of the gate 112, such that the diode 120 is connected in parallel to the gate 112. The protection diode 120 is used to reduce the plasma processing-induced charge damage of the gate dielectric during the fabrication process.

One of the problems associated with the prior art solution using the protection diode includes diode leakage problems. When performing testing of the transistor, measuring gate leakage may become inaccurate due to the diode leakage. Further, any variations in the pitch of the formations during processing can lead to significant diode leakage using the state of the art process. Moreover, the presence of the diode 120 may cause off-state gate leakage problems.

Other problems associated with the prior art solution include the inability to perform stress test using negative stress voltage, due to the presence of the protection diode 120. Further, the prior art includes the inability to perform tests using AC signals because of the protection diode. Moreover, in the event the diode is formed incorrectly, e.g., the diode nodes are placed in opposite configuration as compared to FIG. 1, there is no efficient manner of correcting this error.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for providing an integrated circuit device comprising a protection circuit. And integrated circuit device is formed. A protection component is formed in parallel to the integrated circuit device. The protection component is configured for protecting the integrated circuit device from a portion of a charge. A circuit break device in series to the protection component, wherein the protection component and the circuit break device are in parallel to the integrated circuit device. The circuit break device is configured to break an electrical path of the protection component for electrically terminating the protection component based upon a current signal.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF EMBODIMENTS

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for dispensing a component used for protection during process of an integrated circuit during post-processing manufacturing/testing process. The component may be a protection component (e.g., protection diode) used to protect other components being formed (e.g., transistors) during semiconductor device manufacturing. The protection component may be rendered inactive by terminating an electrical path of the protection component.

In light of rendering ineffective the protection component, embodiments herein may provide for facilitating various types of stress tests, during which AC signals and/or positive or negative stress voltages may be applied. Further, embodiments herein may provide for eliminating a protection component in order to correct a manufacturing error where the protection component was formed in error, e.g., a protection diode being formed in the opposite polarity.

Embodiments herein provide for effectively disabling a protection component, e.g., protection diode, by disrupting an electrical path of the protection component. In one embodiment, a fuse-type device may be used to disable the electrical connection of the protection component, thereby rendering the protection component ineffective or electrically eliminated. Various configurations may be used to perform an efficient elimination of the electrical path of the protection diode 120, rendering the protection diode ineffective.

Figure 2:
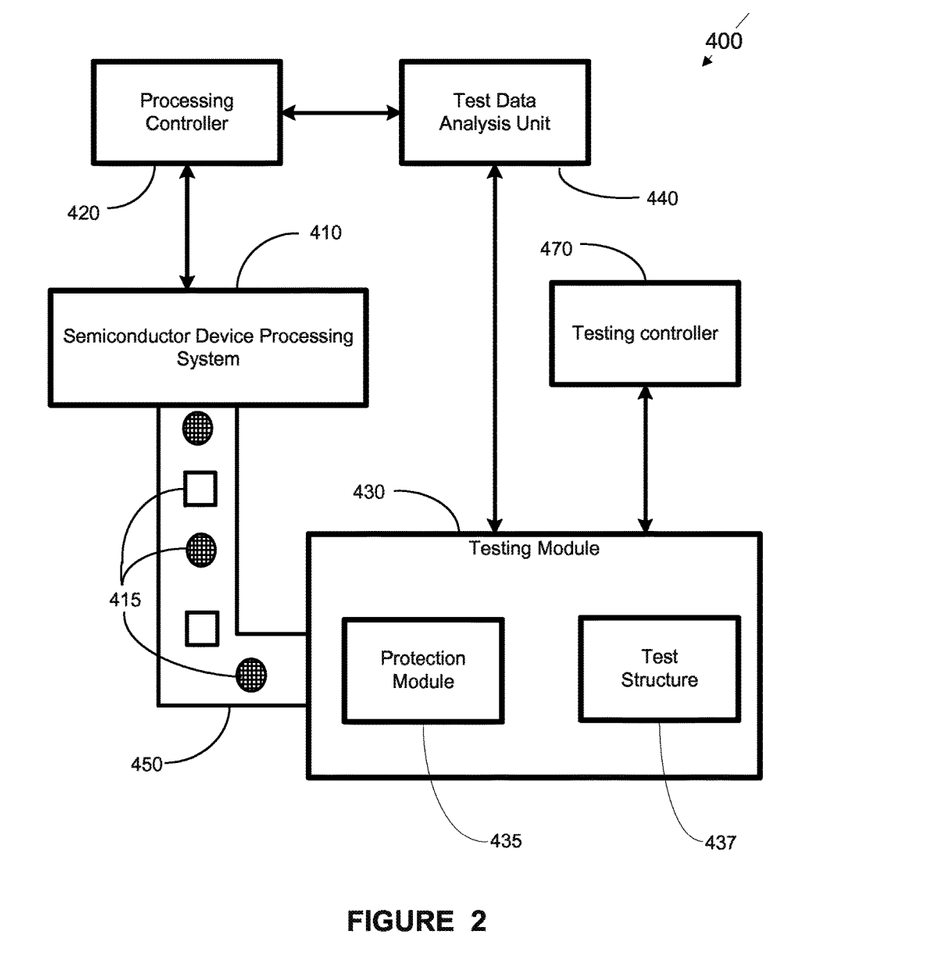
FIG. 2 illustrates a stylized block diagram depiction of a system in accordance with some embodiments herein.

Turning now to FIG. 2, a stylized block diagram depiction of a system in accordance with some embodiments herein, is illustrated. The system 400 may comprise a semiconductor device processing system 410. The semiconductor device processing system 410 may comprise various processing stations, such as etch process stations, photolithography process stations, CMP process stations, etc. One or more of the processing steps performed by the processing system 410 may be controlled by the processing controller 420. The processing controller 420 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 410 may produce integrated circuits on a medium, such as silicon wafers. The processing system 410 may provide processed integrated circuits/devices 415 on a transport mechanism 450, such as a conveyor system. In some embodiments, the conveyor system may be sophisticated clean room transport systems that are capable of transporting semiconductor wafers. In one embodiment, the semiconductor device processing system 410 may comprise a plurality of processing sets, e.g., the $1^{st}$ process step, the $2^{nd}$ process set, etc., as described above.

In some embodiments, the items labeled "415" may represent individual wafers, and in other embodiments, the items 415 may represent a group of semiconductor wafers, e.g., a "lot" of semiconductor wafers. In some embodiments, the feedback provided by the testing module 430 may not be on an immediate, wafer-to-wafer basis, but may be based upon a lot-to-lot basis. The testing module 430 may also be capable of determining a change from one wafer to another within a lot. In many embodiments, the testing module provides test data that may be used by the processing controller 420 to modify one or more process parameters relating to a subsequent lot of semiconductor wafers.

The processed integrated circuits 415 may be provided to a testing module 430 for performing various tests. The integrated circuit/device 415 may comprise a plurality of transistors and at least one dielectric layer. In one embodiment, the dielectric layer may be comprised of silicon dioxide, silicon nitride, siliconoxynitride, or a material having a dielectric constant. The integrated circuit or device 415 may be a transistor, a capacitor, a resistor or a memory cell. In one embodiment, the device 415 is a transistor and the dielectric layer is a gate insulation layer for the transistor.

The testing module 430 may comprise one or more test portions that are capable of performing various dielectric tests upon the integrated circuits. The testing module 430 comprises a test structure 437 that is capable of accommodating a plurality of DUTs and connecting them to voltage supplies as well as measurement devices to perform various tests on the DUT. The testing module 430 is capable of applying various test signals for testing various parameters of devices under test (DUTs). The test module 430 may apply stress voltages of positive and negative polarities.

In some embodiments, the testing module 430 comprises a protection module 435 that is capable of determining whether one or more protections components (e.g., protection diode) are present on a device under test. The protection module 435 may also be capable of terminating the electrical connection of a protection component (e.g., protection diode or a protection capacitor), as described in further details below. By being capable of terminating the electrical connection, the protection module 435 is capable of effectively eliminating a protection component from a device under test. The protection module 435 is capable of performing the termination of the protection component when the DUTs along with the protection components are coupled onto the test structure 437, as indicated in FIGS. 3-7 and accompanying descriptions below.

Moreover, upon effectively terminating a protection component from a device under test, the testing module 430 is capable of detecting various breakdown characteristics of the integrated circuit under test more accurately since leakage currents due to the protection components are terminated along with the electrical connections of the protection components. The testing module 430 is also capable of detecting various threshold shift characteristics of the integrated circuit under test. In one embodiment, the testing module 430 is capable of providing test data relating to a breakdown of a dielectric layer of the device under test and/or at least one characteristic of a transistor of the device. The testing module 430 may use test data in order to compare the degradation of the linear and saturation drain currents, as well as the linear and saturation threshold voltages, and/or other electrical parameters.

Test data from the tests performed by the testing module 430 may be provided to the test data analysis unit 440. The test data analysis unit 440 may be capable of determining whether a protection component is faulty or has been formed incorrectly. For example, the test data analysis unit 440 may determine whether a protection diode has been formed incorrectly such that it is installed in opposite polarity. If the test data analysis unit 440 determines that the protection component is installed incorrectly or is faulty, information relating to these problems may be sent to the testing module 430. The protection module 435 of testing module 430 may then terminate the electrical connection of the protection component.

Further, the test data analysis unit 440 may determine whether the breakdown data indicates that breakdown values are above a predetermined breakdown reference or threshold. Similarly, the test data analysis unit 440 may determine whether the shift in the threshold voltage(s) is not above a corresponding shift reference or threshold values. In one embodiment, these comparisons may be made using look-up functions involving stored data in the system 400 and/or comparison with off-line data. In other embodiments, the determinations with regard to the breakdown values and the threshold shift values may be based upon manual input from external sources.

The testing module 430 may be controlled by the testing controller 470. Although, in one embodiment, the testing controller 470 is depicted as being external to the testing module 430, in an alternative embodiment, the testing module 470 may be within the testing module 430. The testing controller 470 may be a workstation computer, a desktop computer, a laptop computer, a tablet computer, or any other type of computing device comprising one or more software products that are capable of controlling operations of the testing module 430. The testing controller 470 may be configured to control the operation of the protection module 435 for terminating the electrical connection of protection components.

Data from the testing module 430 is received, processed, correlated, and/or stored by the test data analysis unit 440. Data from the test data analysis unit 440 may be provided to the processing controller 420. This data may be used by the processing controller 420 to perform adjustments to subsequent processes performed by the processing system 410, and/or provide information for selecting a particular process set based upon the test data results. In this manner, a feedback process may be performed based upon the learning cycle of the liability testing performed by the testing module 430. This feedback may affect various parameters used to perform processing of integrated circuits and/or selecting particular processes for manufacturing integrated circuits. For example, data from the test data analysis unit 440 may be provided to the processing controller 420. The processing controller 420 may then use this data to adjust one or more process parameters, and/or make a selection of a processing set from a plurality of processing sets. Examples of the process parameter may include, but are not limited to, a temperature, a pressure, a duration, a process gas composition, a process gas concentration, an applied voltage of a process operation, or the like.

The system 400 may be capable of performing analysis for various products involving various technologies. For example, the system 400 may provide test data for CMOS technology, Flash technology, BiCMOS technology, power devices, memory devices (e.g., DRAM devices), NAND memory devices, and/or various other semiconductor technologies.

Figure 3:
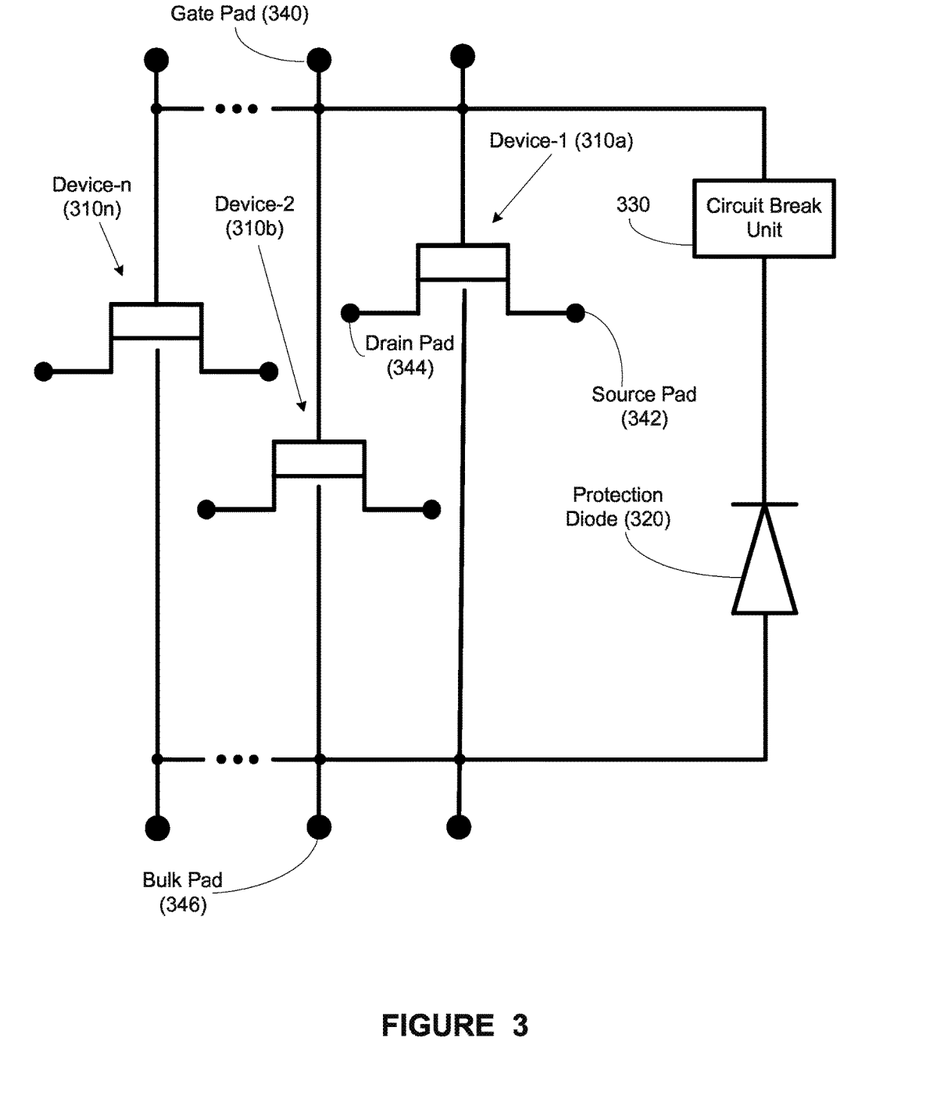
FIG. 3 illustrates a stylized depiction of a test arrangement of a plurality of devices under test, in accordance with some embodiments herein.

Turning now to FIG. 3, a stylized depiction of a test arrangement of a plurality of devices under test, in accordance with embodiments herein is, illustrated. A plurality of DUTs 310a, 320b through 310n (collectively referred to as "310") may be electrically coupled to a test structure 437 in the manner represented by FIG. 3. In one embodiment, the DUTs 310 in FIG. 3 may be FETs, wherein the FETs are arranged in parallel to a protection diode 320 and a circuit break unit 330. The DUTs may be arranged such that a gate pad 340, a source pad 342, a drain pad 344, and a bulk pad 346 may be accessed for electrically driving those nodes, and/or to make measurements from those nodes.

Although embodiments herein are described in terms of a protection diode, those skilled in the art would appreciate that concepts herein may be also applied to other components, such as capacitors, transistors, etc., and remain within the scope of embodiments herein.

As noted above, the protection diode 320 is provided for reducing electrical coupling effects of charges accumulated during processing (e.g., plasma processing) of the DUTs. In many cases, it may be desirable to electrically eliminate the protection diodes 320 prior to testing the DUTs. In one embodiment, the circuit break unit 330 may be forced to disconnect the electrical connection of the protection diode 320, thereby electrically eliminating the protection diode 320 from the DUTs. In this manner, protection components from the DUTs may be eliminated on a permanent basis. The circuit break unit 330 may comprise a variety of components, such as a fuse that may be blown in order to terminate the electrical connection of the protection component. The operations of the circuit break unit 330 may be self-contained and activated by current provided to the unit 330, or alternatively, driven by an external circuit in the testing module 330, such as the protection module 435. More detailed examples of the implementations of the circuit break unit 330 are provided in FIGS. 4-7 and accompanying description below.

Figure 4:
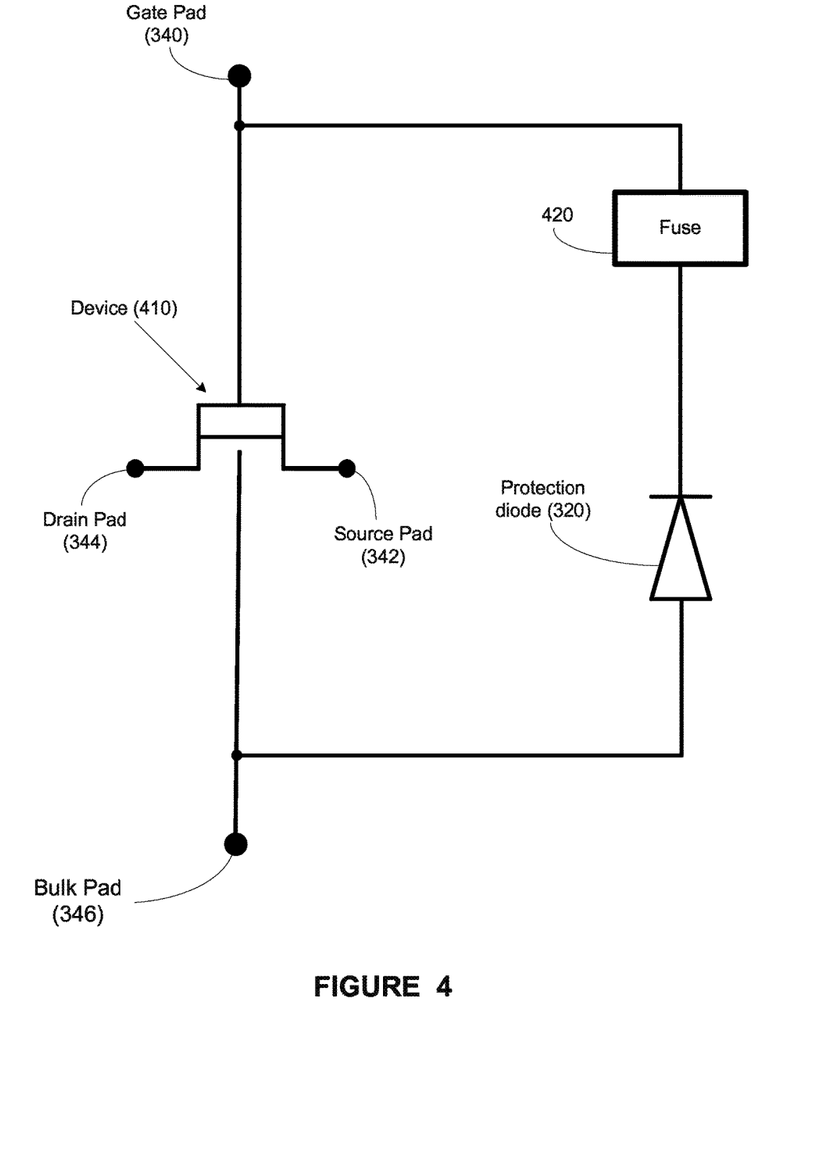
FIG. 4 illustrates a stylized depiction of an implementation of the circuit break unit of FIG. 3, in accordance with a first embodiment.

Turning now to FIG. 4, a stylized depiction of an implementation of the circuit break unit of FIG. 3, in accordance with a first embodiment is illustrated. A device under test 410 is configured in parallel with a protection diode 320 that is in series with a fuse 420. Four nodes may be used to test the device 410, i.e., the gate node 340, the bulk node 346, the drain node 344, and the source node 342.

The configuration of FIG. 4 provides for performing testing of the device 410 and eliminating the electrical connection of the path of the protection diode 320 by blowing the fuse 420. In one embodiment, the fuse may be blown by creating a voltage differential between the gate node 340 and the bulk node 346 such to cause a sufficient current flow through the fuse 320 to blow the fuse 320. This terminates the electrical connection of the protection diode, rendering the diode 320 electrically eliminated. In light of electrically eliminating the protection diode 320, which is no longer needed after processing steps are completed, test signals of different polarities and/or AC signals may be used for testing the device 410. Moreover, leakage currents caused by the presence of the protection diode 320 are reduced or eliminated. This process can be performed without requiring additional pads.

Figure 5:
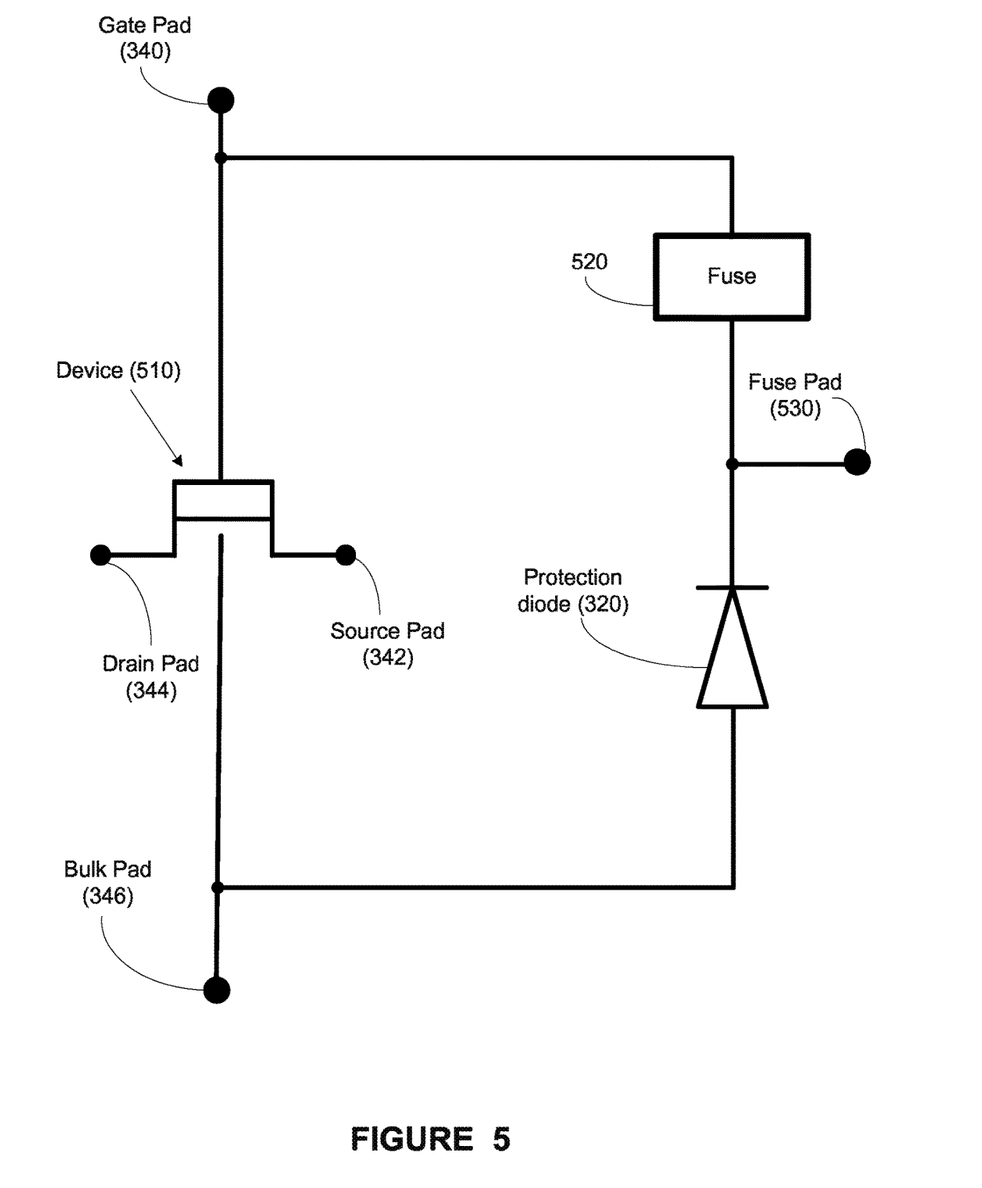
FIG. 5 illustrates a stylized depiction of an implementation of the circuit break unit of FIG. 3, in accordance with a second embodiment.

Turning now to FIG. 5, a stylized depiction of an implementation of the circuit break unit of FIG. 3, in accordance with a second embodiment is illustrated. A device under test 510 is configured in parallel with a protection diode 320 that is in series with a fuse 520. Four nodes are used to test the device 510, i.e., the gate node 340, the bulk node 346, the drain node 344, and the source node 342.

In the embodiment of FIG. 5, an additional pad 530 (i.e., fuse pad) is provided between the fuse 520 and the protection diode 320. The additional pad 530 may be used to generate a voltage differential between the gate pad 340 and the fuse pad 530 such that sufficient current is driven through the fuse to terminate the electrical path of the protection diode 320, while reducing the risk of damaging the device 510 under test. In the embodiment of FIG. 5, one additional pad (fuse pad 530) is used to drive current through the fuse 520 to electrically eliminate the protection diode 320, while providing a reduction of risk of damage to the device under test 510.

Figure 6:
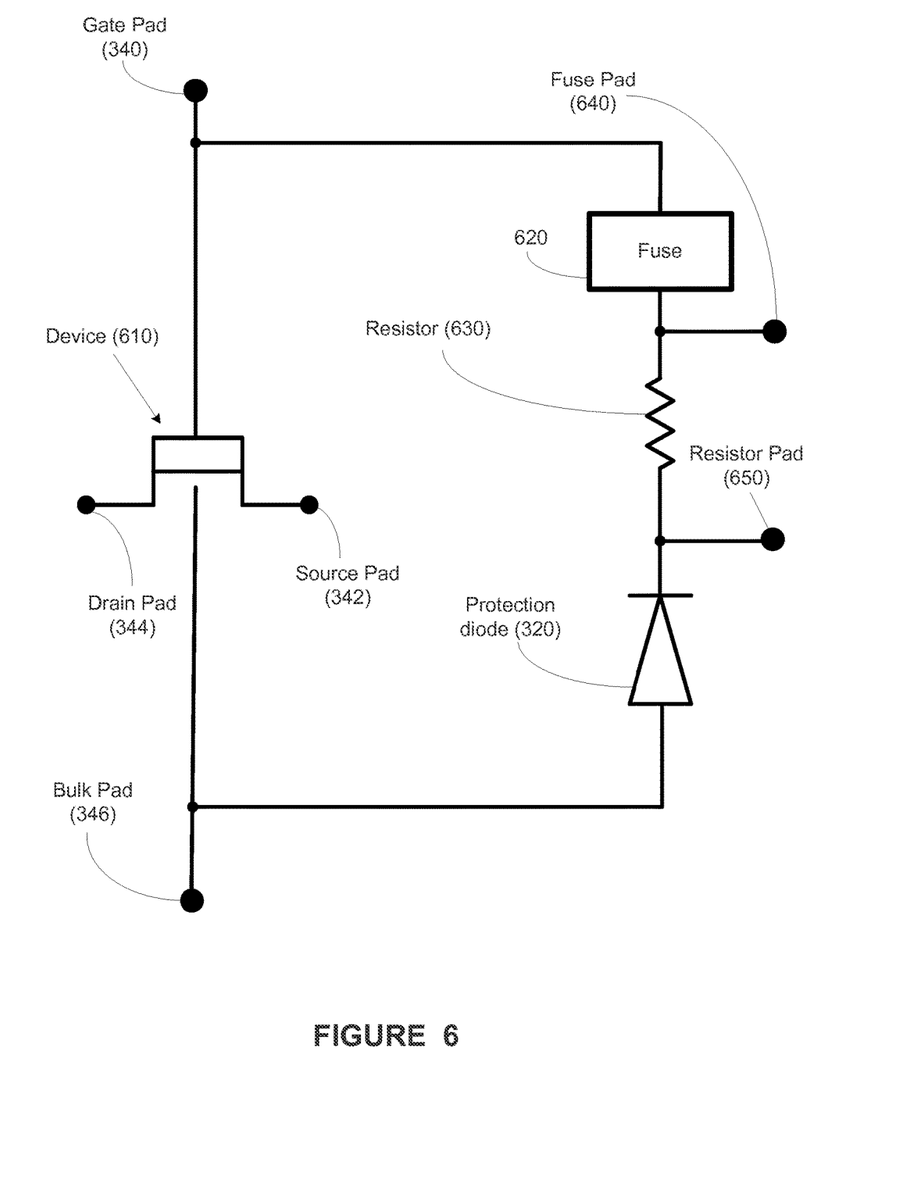
FIG. 6 illustrates a stylized depiction of an implementation of the circuit break unit of FIG. 3, in accordance with a third embodiment.

Turning now to FIG. 6, a stylized depiction of an implementation of the circuit break unit of FIG. 3, in accordance with a third embodiment is illustrated. A device under test 610 is configured in parallel with a protection diode 320 that is in series with a fuse 620 and a resistor 630. Four nodes may be used to test the device 610, i.e., the gate node 340, the bulk node 346, the drain node 344, and the source node 342.

In the embodiment of FIG. 6, two additional pads (640 and 650) are provided. The pad 640 (i.e., fuse pad) is positioned between the fuse 620 and the resistor 630. The pad 650 (i.e., resistor pad) is positioned between the resistor 630 and the protection diode 320. The additional pads 640, 650 may be used to generate a voltage differential between the resistor 630 such that sufficient current is driven through the fuse to terminate the electrical path of the protection diode 320, while reducing the risk of damaging the device 610 under test. In the embodiment of FIG. 6, the two additional pads (pads 640 and 650) are used to drive current through the fuse 620 to electrically eliminate the protection diode 320 while providing a reduction of risk of damage to the device under test 610.

In one embodiment, the gate pad 340 and the node 650 may be tied to ground, while a current may be forced into pad 640. This may create a current flow in the electrical path of the fuse 620, which may cause the fuse 620 to blow and substantially prevent any appreciable current through the electrical path of the device under test 610 and the protection diode 320. In this case, differential in voltage between the gate pad 320 and the bulk pad 346 may be substantially negligible. This way, sufficient current may flow through the fuse 620 to blow the fuse 620, while current flow through the device under test 610 is substantially negligible. Thus, using two additional pads 640, 650, the electrical path of the protection diode 320 may be terminated while reducing the risk of damage to the device under test 610.

Figure 7:
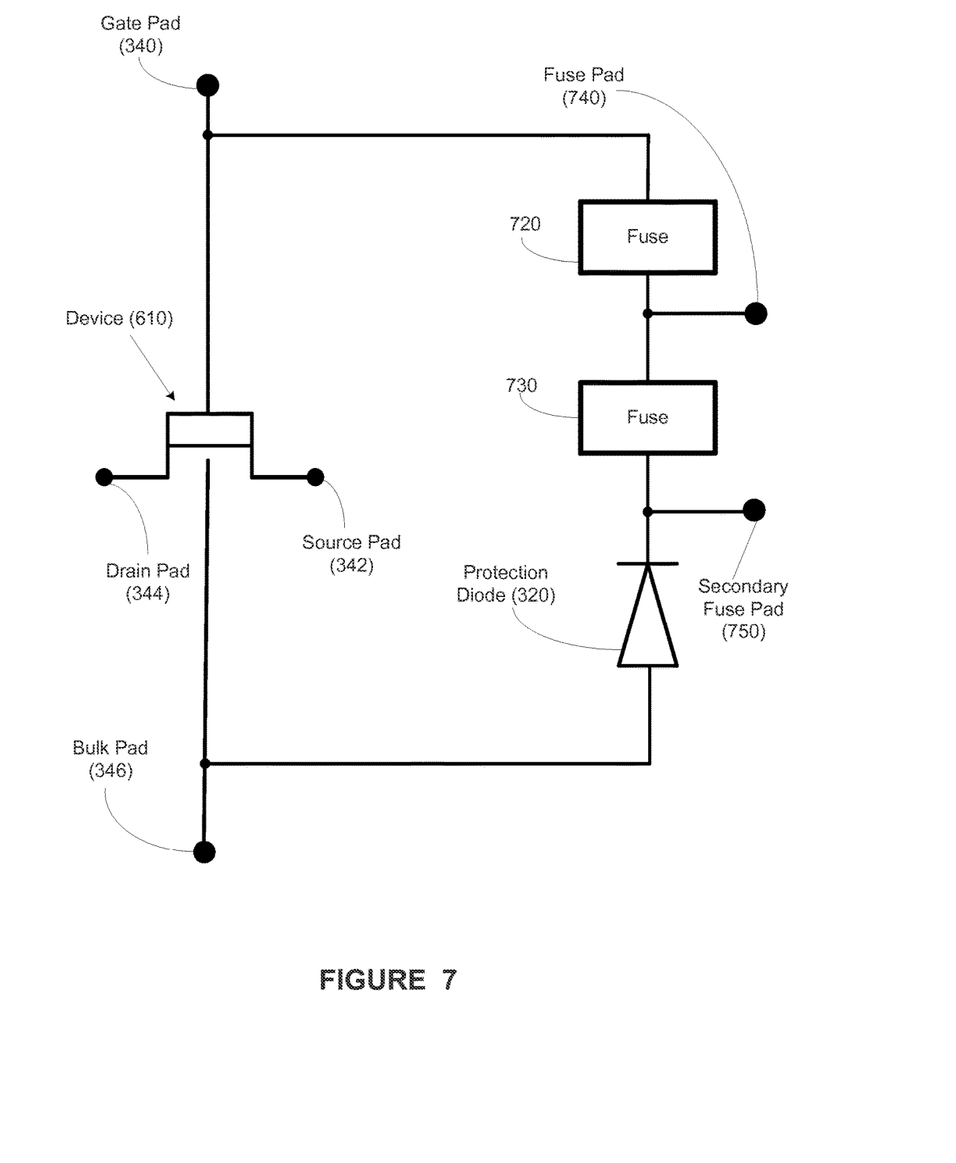
FIG. 7 illustrates a stylized depiction of an implementation of the circuit break unit of FIG. 3, in accordance with a fourth embodiment.

Turning now to FIG. 7, a stylized depiction of an implementation of the circuit break unit of FIG. 3, in accordance with a fourth embodiment is illustrated. A device under test 710 is configured in parallel with a protection diode 320 that is in series with a first fuse 720 and a second fuse 730. Four nodes may be used to test the device 710, i.e., the gate node 340, the bulk node 346, the drain node 344, and the source node 342.

In the embodiment of FIG. 7, two additional pads (740 and 750) are provided. The pad 740 (i.e., fuse pad) is positioned between the gate pad 340 and the first fuse 720. The pad 750 (i.e., secondary fuse pad) is positioned between the first fuse 720 and the second fuse 730. The additional pads 740, 750 may be used to generate a voltage differential between the second fuse 730 such that sufficient current is driven through the second fuse 730 to terminate the electrical path of the protection diode 320, while reducing the risk of damaging the device 710 under test. In the embodiment of FIG. 7, the two additional pads (pads 740 and 750) are used to drive current through the fuse 730 to electrically eliminate the protection diode 320 while providing a reduction of risk of damage to the device under test 710.

In one embodiment, the gate pad 340 and the node 750 may be tied to ground, while a current may be forced into pad 740. This may create a current flow in the electrical path of the protection diode 320, but substantially prevent any appreciable current through the electrical path of the device under test 710. The differential in voltage between the gate pad 340 and the bulk pad 346 is substantially negligible. This way, sufficient current may flow through the fuse 730 to blow the fuse 730 (or the fuse 720), while current flow through the device under test 710 is substantially negligible. Thus, using the two additional pads 740, 750, the electrical path of the protection diode 320 may be terminated while reducing the risk of damage to the device under test 710.

The fuses illustrated in FIGS. 3-7 may be a variety of types of devices that may interrupt an electrical path, such as an efuse resistor, a first metal component, a gate element, a contacting element (to gate, active areas, or other metals), or a variety of types of fuses. Further, although FIGS. 3-7 are depicted as having a single device under test, it should be appreciated that a plurality of devices under test may be configured parallel to the illustrated device under test.

Moreover, the description of the devices under test in FIGS. 3-7 have been exemplified as N-channel FETs (N-FETs). Those skilled in the art would appreciate that similar concepts may also be applied to P-channel FETs (P-FETs). Further, the protection diode 320 in P-FET would be facing in the opposite direction relative to diode shown in FIGS. 3-7.

Figure 8:
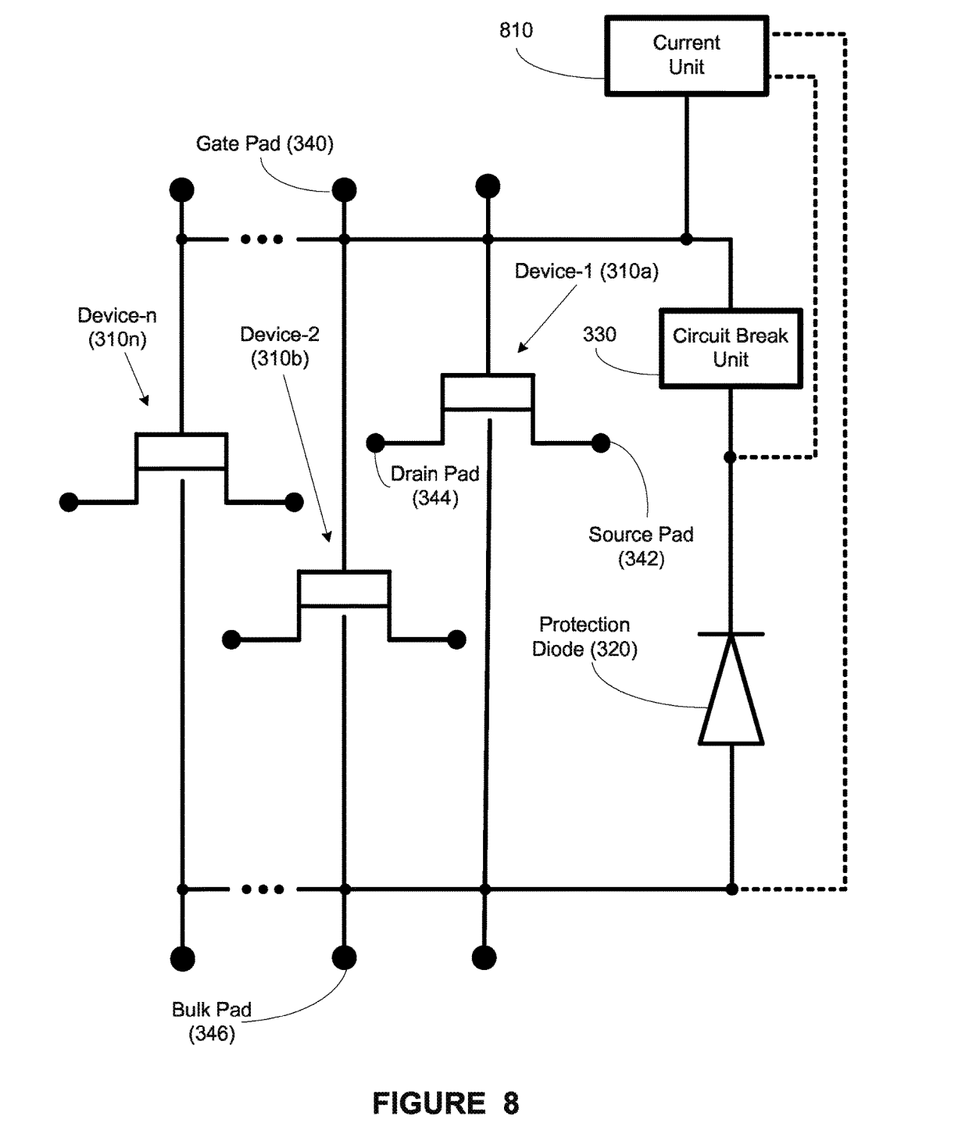
FIG. 8 illustrates a stylized depiction of a test arrangement of a plurality of devices under test having a current unit, in accordance with some embodiments herein.

Turning now to FIG. 8, a stylized depiction of a test arrangement of a plurality of devices under test having a current unit, in accordance with embodiments herein is, illustrated. The current unit 810 maybe used to drive a selectable or programmable amount of current through the protection diode 320. The current unit 810 may be coupled to a variety of devices under test. The current unit 810 may be coupled to a device under test in a manner that a predetermined amount of current may be provided to the electrical line on which the circuit break unit 330 is located. In this manner, the current unit 810 is capable of providing the circuit break unit 330 with sufficient current to cause the circuit break unit 330 to terminate the electrical connection to the protection diode 320.

In one embodiment, the current unit 810 may be part of an integrated circuit device on which the device under test is formed. In an alternative embodiment, the current unit 810 may be part of the testing module 430. For example, the test structure 437 may comprise the current unit 810, which may be positioned such that when a device under test is coupled to the test structure 437, the current unit 810 would be capable of providing a predetermined current to the circuit break unit 330.

The current unit 810 is capable of selecting a one or a plurality of currents, and forcing the selected current through the electrical path of the protection device 320. Sufficient amount of current is provided by the current unit 810 such that one of more of the fuses in the electrical path of the protection device 320 would blow out the electrical path of the protection device 320. A more detailed illustration of the current unit 810 is provided in FIG. 9 and accompanying description below.

Figure 9:
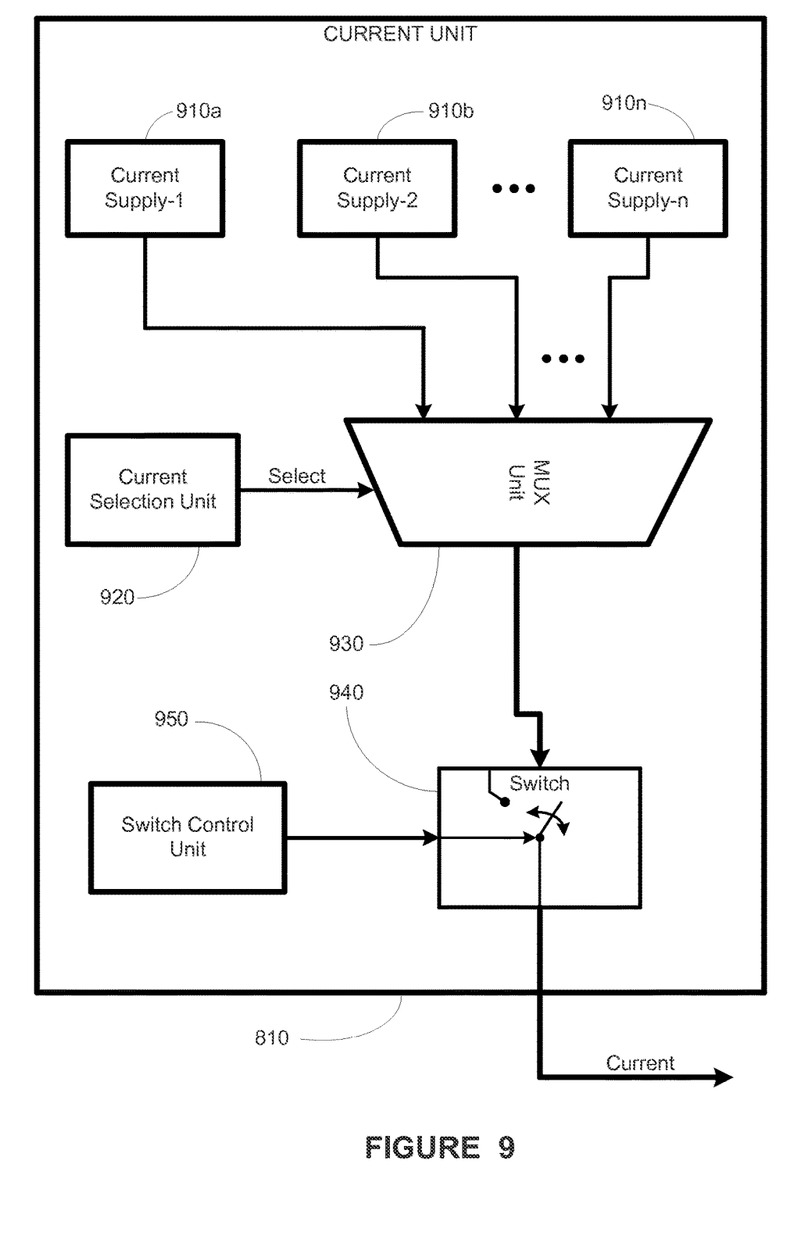
FIG. 9 illustrates a block diagram depiction of the current unit of FIG. 8, in accordance with some embodiments herein.

Turning now to FIG. 9, a block diagram depiction of the current unit of FIG. 8, in accordance with embodiments herein is illustrated. The current unit 810 may comprise a plurality of current supplies (i.e., current supply-1 910*a*, current supply-2 910*b* through current supply-n 910*n*, collectively referred to as "current supplies 910"). Each of the current supplies 910 may provide a different, predetermined amount of current. In some embodiments, the current supplies 910 may comprise a series of current divider circuits that are capable of separating out and providing currents of different values. In an alternative embodiment, the current supplies 910 may be positioned external to the current unit 810 and provide "1 through n" lines of various current signals.

The various outputs of the current supplies 910 may be provided into a multiplexer type device (MUX unit 930), wherein a select signal may be used to select one of the current signals for providing a current signal to the circuit break unit 330 of a device under test. In one embodiment, the select signal may be of sufficient bits as to select one of the 0-n current signals. By providing the select signal, a current selection unit 920 is capable of selecting one of the current signals from the current supply 910 for providing a current to the circuit break unit 330. The output of the MUX unit 930 may be coupled to a switch 940.

A switch control unit 950 may control the operation of the switch 940. Therefore, when a predetermined current is selected for terminating an electrical connection of a protection component, the current selection unit 920 may select that current, and the switch control unit 950 may control the switch 940 to provide the selected current to the circuit break unit 330 of a device under test. In one embodiment, the test controller 420 may control the operations of the current selection unit 920 and the switch control unit 950.

Figure 10:
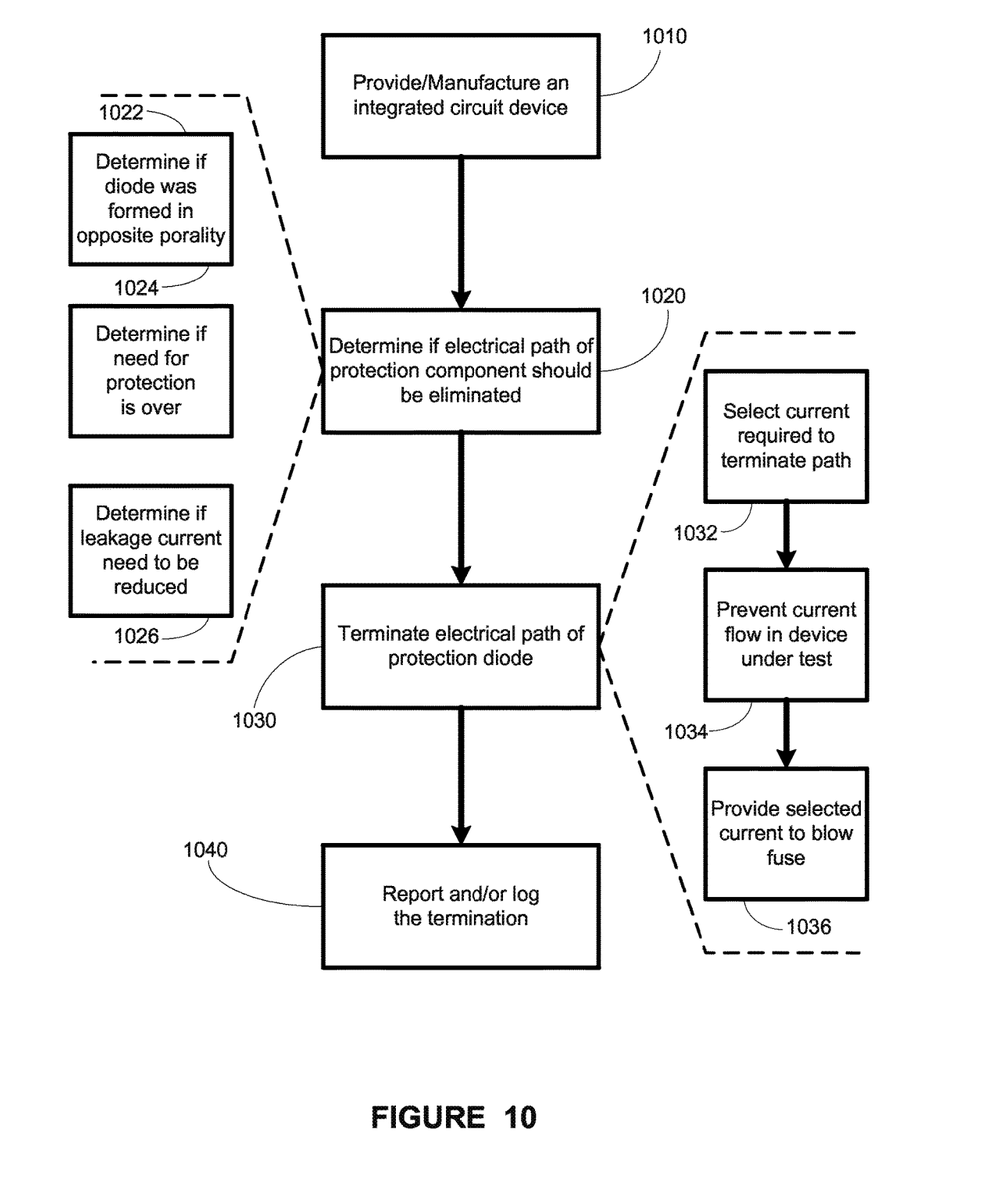
FIG. 10 illustrates a flowchart depiction of the method of electrically eliminating a protection component from a device under test, in accordance with some embodiment herein.

Turning now to FIG. 10, a flowchart depiction of the method of electrically eliminating a protection component from a device under test, in accordance with embodiment herein, is illustrated. An integrated circuit device may be manufactured and provided for testing/error corrections (block 1010). A testing system may determine if the protection component associated with a device under test should be electrically eliminated (block 1020). This process may include determining if the protection component (e.g., protection diode) has been formed on the circuit backwards (block 1022). Further a determination may be made whether the need for the protection component is over, i.e., protection from the protection component is no longer required (block 1024). Also, a determination may be made as to whether leakage current that may be caused by the protection component should be reduced (block 1026). Based upon one or more of these determinations (i.e., blocks 1022-1026), a decision may be made that the electrical path of the protection components should be terminated.

Based upon the decision to eliminate the protection component, the electrical path of the protection component may be terminated (block 1030). This process may include selecting a current required to terminate the electrical path (block 1032). One or more steps may be taken to prevent substantial current flow in the device, e.g., by providing the same voltage potential across the device to prevent appreciable current flow (block 1034). A predetermined level of current may then be provided to a circuit break unit 330 (e.g., a fuse) to cause a break in the electrical path of the protection component (block 1036). In this manner, the protection component may be electrically eliminated from the device under test. The elimination of the protection component may be reported and logged (block 1040).

In this manner a protection component, such as a protection diode, may be electrically eliminated from an integrated circuit device. This may provide for correcting a process error, (e.g., a diode being formed in an incorrect polarity) and/or reduce leakage current problems caused by a protection device that is no longer needed.

The system 400 may be capable of manufacturing and testing various products that include transistors with active and inactive gates involving various technologies. For example, the system 900 may provide for manufacturing and testing products relating to CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of terminating a protection component, comprising:
    forming an integrated circuit device;
    forming a protection component in parallel to said integrated circuit device, said protection component being configured for protecting said integrated circuit device from a portion of a charge;
    forming a first circuit break device in series to said protection component wherein said protection component and said first circuit break device are positioned in parallel to said integrated circuit device, and wherein said first circuit break device is configured to break an electrical path of said protection component for electrically terminating said protection component based upon a current signal;
    forming a first fuse pad between said protection component and said first circuit break device;
    forming a second circuit break device between said protection component and said first circuit break device;
    forming a second fuse pad, wherein a voltage differential between said first fuse pad and said second fuse pad is capable of providing a fuse current capable of blowing at least one of said first circuit break device or said second circuit break device; and
    forming a plurality of current supplies and a current unit, wherein the current unit is capable of selecting one of the current supplies and providing the selected current supply to said first fuse pad or said second fuse pad.

2. The method of claim 1, further comprising:
    determining whether said protection component is not required during testing; and
    providing, in response to a determination that said protection component is not required, said current signal through said first circuit break device.

3. The method of claim 1, wherein forming a protection component comprises forming a diode.

4. The method of claim 1, wherein forming said first circuit break device in series with said protection component comprises forming a fuse in series to said protection component, wherein current signal is capable of blowing said fuse.

5. The method of claim 1, further comprising determining whether said protection component is not required, comprising determining whether manufacturing of the integrated circuit device has been completed.

6. The method of claim 1, wherein forming said first circuit break device in series with said protection component comprises forming a resistor in series with said first circuit break device for providing a current path through said first circuit break device and reducing a current flow through said integrated circuit device.

7. The method of claim 1, wherein:
    forming said integrated circuit device comprising forming a transistor, wherein forming said transistor comprises:
    forming a drain region on a substrate;
    forming a gate region on said substrate adjacent said drain region; and
    forming a source region on said substrate adjacent said gate region;
    forming said first circuit break device comprises forming a diode in series with a fuse, wherein said diode and said fuse are formed in parallel to said transistor, and wherein said diode is capable of dissipating at least a portion of said charge.

8. The method of claim 7, further comprising:
    coupling electrically a source pad to said source region;
    coupling electrically a gate pad to said gate region; and
    coupling electrically a drain pad to said drain region;
    wherein said source, gate and drain pads are capable of providing for testing said transistor.

9. The method of claim 8, wherein a voltage differential between said gate pad and said fuse pad is capable of providing a fuse current capable of blowing said fuse.

10. The method of claim 9, wherein forming said first circuit break device further comprises:
    forming a resistor between said fuse and said diode; and
    forming a resistor pad wherein a voltage differential between said fuse pad and said resistor pad is capable of providing said fuse current capable of blowing said fuse.

11. The method of claim 1, wherein said protection component is further capable of at least partially dissipating said charge resulting from a plasma process.

12. An integrated circuit device, comprising:
    a transistor, comprising:
        a source region on a substrate;
        a gate region on said substrate adjacent said source region; and
        a drain region on said substrate adjacent said gate region;
    a protection circuit comprising a diode in series with a first circuit break device, wherein said protection circuit is configured in parallel with said transistor, wherein said protection circuit is capable of protecting said transistor from at least a portion of a charge, and wherein said first circuit break device is configured to break an electrical path of said diode for electrically terminating said diode based upon a current signal;
    a first fuse pad between said diode and said first circuit break device;
    a second circuit break device between said diode and said first circuit break device;
    a second fuse pad, wherein a voltage differential between said first fuse pad and said second fuse pad is capable of providing a fuse current capable of blowing at least one of said first circuit break device or said second circuit break device;
    a plurality of current supplies; and
    a current unit, wherein the current unit is capable of selecting one of the current supplies and providing the selected current supply to said first fuse pad or said second fuse pad.

13. The integrated circuit device of claim 12, wherein said integrated circuit comprises
    a source pad electrically coupled to said source region;
    a gate pad electrically coupled to said gate region; and
    a drain pad electrically coupled to said drain region;
    wherein said source, gate and drain pads are capable of providing for testing said transistor.

14. The integrated circuit device of claim 13, wherein said first circuit break device comprises a fuse, wherein said fuse is capable of being blown by said current signal.

15. The integrated circuit device of claim 14, wherein said first circuit break device further comprises a fuse pad between said fuse and said diode, wherein a voltage differential between said gate pad and said fuse pad is capable of providing a fuse current for blowing said fuse.

16. The integrated circuit device of claim 15, wherein said first circuit break device further comprises:
a resistor between said fuse and said diode; and
a resistor pad wherein a voltage differential between said fuse pad and said resistor pad is capable of providing said fuse current capable of blowing said fuse.

17. A system, comprising:
a semiconductor device processing system to provide an integrated circuit device, wherein said integrated circuit device comprises:
at least one transistor, wherein said transistor comprises;
a source region on a substrate;
a gate region on said substrate adjacent said source region; and
a drain region on said substrate adjacent said gate region;
a protection circuit comprising a diode in series with a first circuit break device, wherein said protection circuit is configured in parallel with said transistor, wherein said protection circuit is capable of protecting said transistor from at least a portion of a charge, and wherein said first circuit break device is configured to break an electrical path of said diode for electrically terminating said diode based upon a current signal;
a first fuse pad between said diode and said first circuit break device;
a second circuit break device between said diode and said first circuit break device;
a second fuse pad, wherein a voltage differential between said first fuse pad and said second fuse pad is capable of providing a fuse current capable of blowing at least one of said first circuit break device or said second circuit break device;
a plurality of current supplies; and
a current unit, wherein the current unit is capable of selecting one of the current supplies and providing the selected current supply to said first fuse pad or said second fuse pad;
and
a processing controller operatively coupled to said semiconductor device processing system, said processing controller configured to control an operation of said semiconductor device processing system.

18. The system of claim 17, further comprising:
a testing module for testing said transistor, wherein said testing module is capable of providing said current selected by said current unit.

19. The system of claim 17, wherein said integrated circuit device is at least one of a CMOS device, a BiCMOS device, a Flash device, a DRAM memory device, and a power device.

* * * * *